United States Patent [19]

Rose

[11] Patent Number: 4,501,777
[45] Date of Patent: Feb. 26, 1985

[54] METHOD OF SEALING OF CERAMIC WALL STRUCTURES

[75] Inventor: Douglas N. Rose, Macomb, Mich.

[73] Assignee: The United States of America as represented by the Secretary of the Army, Washington, D.C.

[21] Appl. No.: 421,607

[22] Filed: Sep. 22, 1982

[51] Int. Cl.³ .................. C23C 11/00; C23C 13/00
[52] U.S. Cl. ........................ 427/255; 427/255.1; 427/255.2
[58] Field of Search ............ 427/255, 255.1, 255.2, 427/237, 314, 238, 248.1, 140

[56] References Cited

U.S. PATENT DOCUMENTS

| | | | |
|---|---|---|---|
| 3,578,495 | 5/1971 | Pammer et al. | 427/255.2 |
| 3,798,061 | 3/1974 | Yamazaki | 427/255.2 |
| 4,089,992 | 5/1978 | Doo et al. | 427/255.1 |
| 4,196,233 | 4/1980 | Bitzer et al. | 427/255.2 |
| 4,374,163 | 2/1983 | Isenberg | 427/255.2 |

FOREIGN PATENT DOCUMENTS

| | | | |
|---|---|---|---|
| 5122634 | 8/1974 | Japan | 427/255.2 |
| 54-155211 | 5/1978 | Japan | 427/255.2 |

Primary Examiner—Sadie L. Childs
Attorney, Agent, or Firm—Peter A. Taucher; John E. McRae; Robert P. Gibson

[57] ABSTRACT

A method of sealing the pores in wall structures formed of sintered ceramic powders, especially silicon nitride or silicon carbide. The sealing operation is performed by pumping two reactant gases into the pores of the wall structure from opposite sides of the structure. As the gases meet one another within the pores they chemically react to form a solid ceramic sealant material, e.g., silicon nitride or silicon carbide. The reactant gases are selected so that the in situ-formed sealant corresponds chemically to the wall structure material.

1 Claim, 4 Drawing Figures

METHOD OF SEALING OF CERAMIC WALL STRUCTURES

GOVERNMENT INTEREST

The invention described herein may be manufactured, used, and licensed by or for the Government for governmental purposes without payment to me of any royalty thereon.

BACKGROUND AND SUMMARY OF THE INVENTION

This invention relates to heat exchangers, particularly heat exchangers formed of reaction sintered silicon nitride or reaction sintered silicon carbide. Such heat exchangers would be useful in high temperature applications above 2000° F. for conserving or exchanging heat energy. A particular application for my improved heat exchanger is a recuperator in gas turbine engines for aircraft or land vehicles, e.g. military tanks. The reaction sintered silicon nitride or carbide is desirable for such high temperature applications because of its small dimensional change on firing, and low creep or other physical changes at high operating temperatures. Unfortunately sintered silicon carbide or nitride articles, as conventionally formed, exhibit relatively high porosity. If used for heat exchangers such silicon carbide or silicon nitride materials would undesirably form leakage paths through the pores, thus rendering the exchangers useless for their intended purpose.

My invention relates to means and methods for sealing the pores in silicon carbide or silicon nitride wall structures, whereby said silicon structures can be formed into useful heat exchangers for high temperature applications. Prior to my invention others have attempted to seal off the undesired porosity in silicon carbide or silicon nitride wall structures. One prior art method that I am aware of involves the chemical vaporization and deposition of silicon carbide on a porous silicon carbide or silicon nitride substrate. However, if the deposited coating is thick enough to form a satisfactory seal for the porosity then it tends to wholly or partially clog the relatively small channels or passages in the heat exchanger, thus rendering the exchanger unsuitable as a fluid flow mechanism.

I contemplate a method of sealing off the undesired porosity which involves the application of two chemical reactants in gaseous form onto opposite surfaces of a heat exchanger constructed out of silicon carbide or silicon nitride. I believe that when the reactant gases penetrate into the pores of the heat exchangers they will contact each other within the individual pores; at that point in time they will chemically react to form a reaction product that will remain in the pores of the silicon carbide or silicon nitride substrate. The reactants are preselected so that the reaction product is chemically the same material as the base material, i.e. silicon nitride or silicon carbide. In the case of silicon nitride heat exchangers I propose to use as one reactant material gaseous ammonia, and as the other reactant material either silicon chloride or silicon hydride. The reaction product in that case is crystalline silicon nitride. In the case of silicon carbide heat exchangers I contemplate using as reactants methyltrichlorosilane and hydrogen.

THE DRAWINGS

Figure 1:
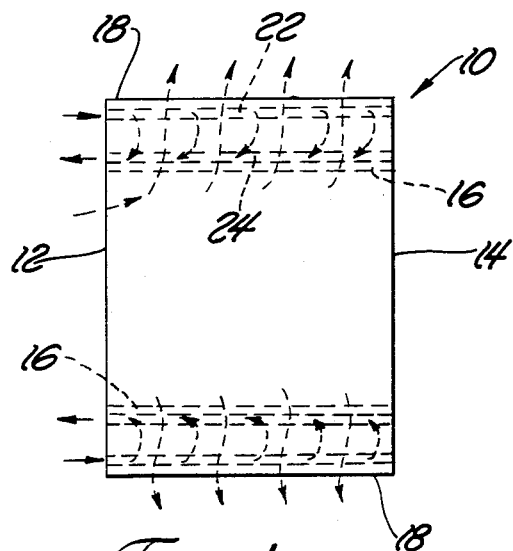
FIG. 1 is an elevational view of a heat exchanger embodying my invention.
Figure 4:
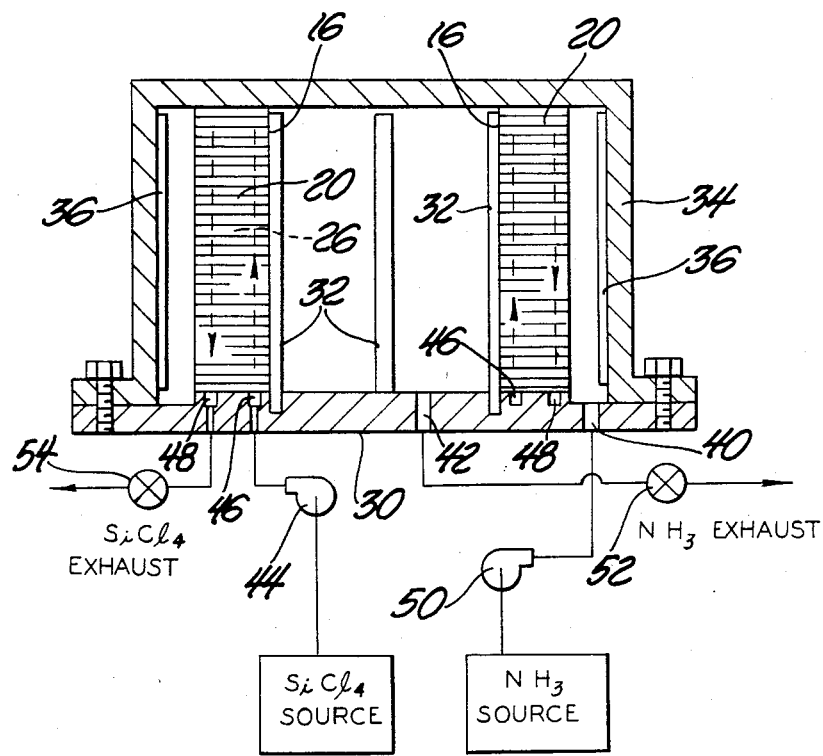

FIG. 4 schematically illustrates a treating apparatus used to seal out porosity in the walls of the FIG. 1 heat exchanger.

Referring in greater detail to FIG. 1, there is shown an annular heat exchanger 10 having flat end faces 12 and 14, an inner cylindrical surface 16, and an outer cylindrical surface 18. The exchanger provides two separate flow paths for separate non-contacting fluids such as relatively low temperature air (900° F.) flowing from a compressor to a combustor, and relatively high temperature exhaust gas (2200° F.) flowing from a turbine engine to the atmosphere. As the exhaust gas flows through the heat exchanger it heats the heat exchanger walls and thus preheats the air going to the combustor, as more fully explained in U.S. Pat. No. 3,831,674 issued to W. Stein and S. Straniti.

Figure 2:
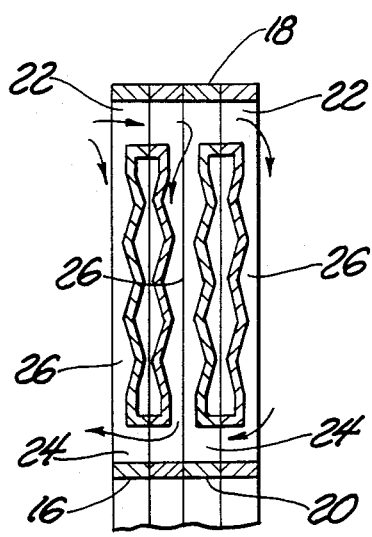
FIGS. 2 and 3 are fragmentary enlarged cross sectional views of the internal structure of the FIG. 1 heat exchanger.
Figure 3:
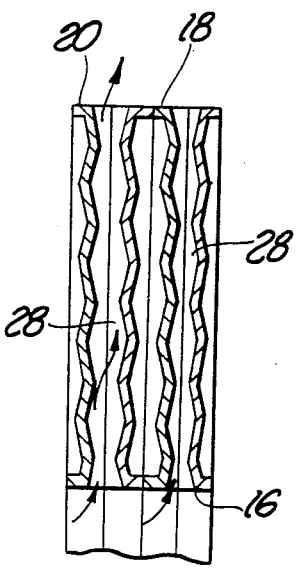

My invention does not relate to specific configurations of the heat exchanger walls or components. However, for illustration purposes I show the exchanger to be formed of a stack of annular ceramic disks or plates 20 adhered together by sintering processes. FIGS. 2 and 3 show four similar disks 20; the actual heat exchanger would in practice be comprised of large numbers of such disks, e.g. two hundred or more. Each disk 20 has a number of equally-spaced holes 22 near its outer circumferential edge 18, and a number of equally-spaced holes 24 near its inner circumferential edge 16. During service low temperature inlet air flows through holes 22 in a left-to-right direction, then generally radially inwardly through various channels or passages 26 to holes 24; outlet air flow is in a right-to-left direction as shown in FIG. 1. The rightmost disk (not shown) seals the defined air flow path.

Flow of hot exhaust gas takes place through radial passages 28 formed by and between adjacent disks 20. Passages 28 are offset or staggered circumferentially from the passage system defined by holes 22, 24 and channels 26. Thus, FIG. 2 is taken in a first radial plane, and FIG. 3 is taken in a second radial plane spaced a slight circumferential distance from FIG. 2. FIGS. 2 and 3 are merely illustrative of the passage configurations that can be employed in conjunction with practice of my invention.

Each of the annular disks 20 is formed of reaction bonded (or sintered) silicon nitride or silicon carbide. Individual disks are initially formed of finely divided (powdered) silicon by conventional cold pressing or die pressing procedures. The green unfired disks may be stacked on one another and sintered at an elevated temperature in a nitrogen atmosphere to form the complete heat exchanger of FIG. 1. Such a heat exchanger has undesired porosity that I believe can be corrected by treatment with gaseous reactants, as described herebelow. FIG. 4 schematically illustrates an apparatus that I believe can be used to first sinter the heat exchanger disks and second treat the sintered assembly with gaseous reactants. The FIG. 4 apparatus comprises a base plate 30 having suitable upstanding guide rods 32 oriented to engage internal edges 16 of the various disks 20 to maintain said disks in axially aligned relation. A bell or hollow cover 34 is lowered around the stack of disks and fastened to plate 30 with threaded nuts or other suitable fasteners. Heating elements 36 are carried on the inner surface of the cover to heat the disc stack to an elevated sintering temperature, e.g. 1400° C. in the case of silicon nitride. At the same time gaseous nitrogen containing some hydrogen is pumped into and through the passages formed between the disks 20. The nitrogen reacts with the silicon to form silicon nitride. The gaseous nitrogen may be pumped through one set of heat exchanger passages 26 (FIG. 2), or through the other set of passages 28 (FIG. 3), or preferably through both sets of passages. The FIG. 4 apparatus includes flow openings 40 and 42 in plate 30 for passing a gaseous nitrogen-hydrogen mixture through heat exchanger passages 28. After several hours exposure to the high temperature, nitrogen atmosphere the disks 20 are transformed into a sintered product, silicon nitride, $Si_3N_4$. At this stage in the process the formed heat exchanger has its final configuration, strength and temperature resistance. However, the walls of the exchanger have undesired porosity.

Under my invention the formed heat exchanger is subjected to a post-formation chemical treatment to seal the pores in its wall structure. The FIG. 4 apparatus can be used to contain the heat exchanger during this chemical treatment. As shown in FIG. 4, a pump 44 feeds gaseous silicon tetrachloride, $SiCl_4$, into an annular chamber 46 in base plate 30, thence into the air passage system 26 of the heat exchanger. Excess silicon tetrachloride is exhausted from the heat exchanger passages through an annular chamber 48 in plate 30. Simultaneously the other pump 50 causes gaseous ammonia to be pumped through passages 28 of the heat exchanger. Heater elements 36 maintain the heat exchanger walls at elevated temperatures, sufficient to enable the gaseous silicon tetrachloride and ammonia to chemically react, as follows:

$$3SiCl_4 + 16NH_3 \rightarrow Si_3N_4 + 12NH_4Cl$$

At the elevated temperatures the ammonium chloride decomposes according to the reaction:

$$NH_4Cl \rightarrow NH_3 + HCl$$

It is believed that the relatively hot gaseous reactants pumped through the heat exchanger passages 26 and 28 will penetrate the pores in the heat exchanger walls. As the reactant gases meet within these pores they will react to form crystalline silicon nitride. This chemical reaction will occur only within the pores where the reactants come in contact with each other. The heat exchanger wall thickness will not be undesirably increased; the in-situ formed silicon nitride will be located only in the pores of the wall structure substrate.

It is theorized that during the course of the chemical reaction the pores in the substrate wall may be gradually reduced in size. As the pores become smaller the resistance to gas flow into the pores may increase. At that point it may be helpful to vary the relative pressures of the two gaseous reactants, e.g. by increasing the pressure of the silicon chloride above that of the ammonia, or increasing the pressure of the ammonia above that of the silicon chloride, to achieve better penetration and contact of the reactant gases. It is believed desirable to achieve a fairly complete filling of the pores from one face of the substrate wall to the other face. By slightly varying the pressures of the reactant gases it should be possible to cause the chemical reaction to take place near one wall face, midway between the wall faces, or near the other wall face. A relatively thick deposition of the filler material is thus achieved for enhanced porosity elimination. Valves 52 and 54 in the exhaust passages can be selectively operated to partially closed positions to slightly increase the absolute pressures in the ammonia or silicon chloride gaseous systems. Care must be exercised in pressure selection to avoid the possibility of the reaction occurring outside the pores of the wall structure, i.e. in passages 26 or 28. In general the pressures of the two reactant gases should be the same, within reasonably close limits, during the initial stage of process. It is only after the pores have been partially plugged that it may be desirable to have the pressure of one gas higher than that of the other gas.

Other reactant gases can be used in practice of the invention. For example, silicon hydride can be substituted for silicon chloride. In that case the reaction becomes:

$$3SiH_4 + 4NH_3 \rightarrow Si_3N_4 + 12H_2$$

The FIG. 4 system can be used with other reactant gases and heat exchanger wall materials. In the case of heat exchanger walls formed of reaction sintered silicon carbide the reactant gases can be methyltrichlorosilane and hydrogen.

I contemplate that my invention will be used primarily to eliminate porosity in high temperature heat exchangers formed of sintered silicon nitride or silicon carbide. The invention conceivably could find use in other items of high temperature hardware where porosity is a problem, e.g. high temperature valves and fluid lines.

I wish it to be understood that I do not desire to be limited to the exact details of construction shown and described for obvious modifications will occur to a person skilled in the art.

I claim:

1. A method of sealing the pores in a sintered ceramic heat exchanger designed to be used in a hot gas turbine engine, wherein the heat exchanger wall structure is formed of a material selected from silicon nitride and silicon carbide, the heat exchanger wall structure defining two separate flow passages for different gases when the heat exchanger is placed in service:

said method comprising the steps of pumping a first reactant gas into one of the flow passages; pumping a second reactant gas into the other flow passage; maintaining each reactant gas at a sufficient pressure to cause the gases to penetrate into the pores of the heat exchanger walls where they will chemically react to form solid permanent sealing fillers within the pores; and heating the heat exchanger walls while the reactant gases are chemically reacting within the pores; said pumping steps being carried out so that the pressures of the reactant gases are maintained substantially equal during the major part of the time that the chemical reaction is taking place, and the pressures of the reactant gases are selectively varied during the final stages of the reaction to cause one reactant gas to advance further into the porous walls than the other reactant gas; the first reactant gas being a material selected from silicon hydride, silane and silicon tetrachloride; the second reactant gas being a material selected from ammonia and hydrogen; the reactant gases being selected so that the reaction product is the same material as the material originally used to form the heat exchanger wall structure.

* * * * *